United States Patent [19]

Rabii

[11] Patent Number: 5,121,117
[45] Date of Patent: Jun. 9, 1992

[54] BALANCED A/D CONVERTER

[75] Inventor: Khosro M. Rabii, Arlington Heights, Ill.

[73] Assignee: Zenith Electronics Corporation, Glenview, Ill.

[21] Appl. No.: 671,315

[22] Filed: Mar. 19, 1991

[51] Int. Cl.⁵ .............................................. H03M 1/06
[52] U.S. Cl. ..................................... 341/118; 358/174
[58] Field of Search ........................ 358/172, 174, 176; 341/118, 139

[56] References Cited

U.S. PATENT DOCUMENTS

| | | | |
|---|---|---|---|
| 4,434,439 | 2/1984 | Steckler et al. | 358/174 |
| 4,590,458 | 5/1986 | Evans et al. | 341/118 |
| 4,625,240 | 11/1986 | Yablonski et al. | 358/143 |
| 4,831,378 | 5/1989 | Baars et al. | 341/139 |
| 4,837,625 | 6/1989 | Douziech et al. | 358/174 |
| 4,908,621 | 3/1990 | Polonio et al. | 341/120 |
| 4,970,594 | 11/1990 | Kitaura et al. | 358/172 |

*Primary Examiner*—A. D. Pellinen
*Assistant Examiner*—Marc S. Hoff

[57] ABSTRACT

A balanced A/D converter system for a video signal. A clamp reference, corresponding to synchronizing pulse magnitude, is developed. The output of an A/D converter is summed with the clamp reference to develop a first correction signal for offsetting the video signal to the synchronizing pulse back porch level at the input of the A/D converter. A peak video reference signal is developed and summed with the output of the A/D converter to develop a second correction signal for controlling the gain of a variable gain amplifier coupled to the input of the A/D converter. Offsetting the video signal to the back porch level and amplifying the video signal based upon its maximum level enables the full utilization of the total range of the A/D converter.

8 Claims, 1 Drawing Sheet

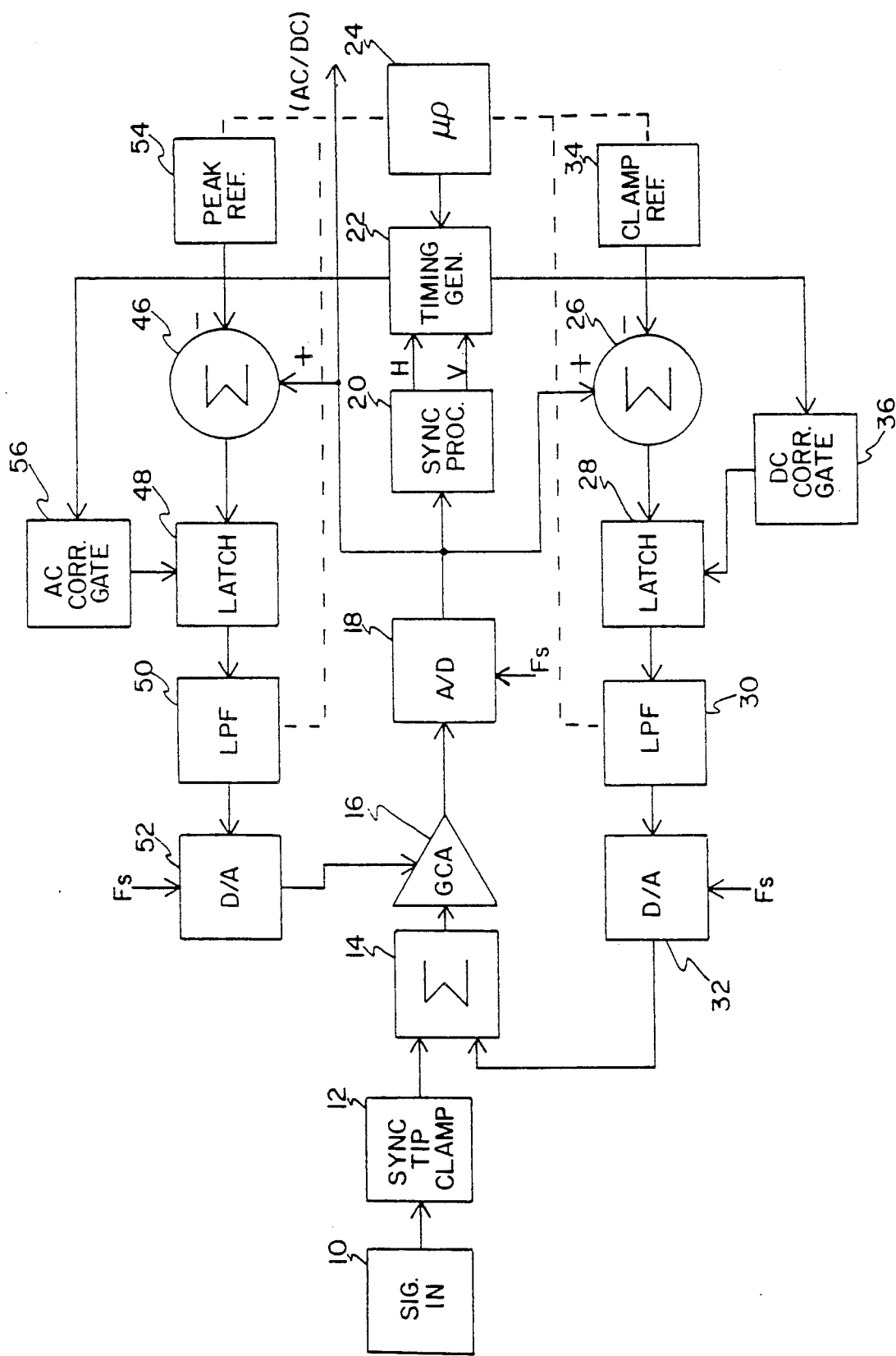

BALANCED A/D CONVERTER

BACKGROUND OF THE INVENTION AND PRIOR ART

This invention relates in general to analog-to-digital (A/D) converter systems and particularly to a balanced A/D converter system for use with television video signals. Modern television receivers utilize a significant amount of digital processing circuitry under microprocessor control. Analog video signals need to be digitized, i.e. converted to digital form to be compatible with the digital processing circuitry. The function of the A/D converter is to quantize analog signals. Similarly, a D/A converter converts digital signals into analog form. Every A/D converter has a dynamic range that determines the maximum signal magnitude that may be processed without distortion. Under ideal conditions, the analog video signal fully uses the total range of the converter. Less than full utilization of the A/D converter dynamic range reduces the signal-to-noise ratio and may introduce artifacts in the signal output. On the other hand, exceeding the dynamic range of the A/D converter results in signal distortion. There is thus a need in the art for a balanced A/D converter system that adjusts the incoming video signal to match the dynamic range of the A/D converter for optimum processing.

OBJECTS OF THE INVENTION

A principal object of the invention is to provide an improved video signal A/D converter system.

Another object of the invention is to provide an A/D converter system that faithfully translates video signals with maximum gain.

BRIEF DESCRIPTION OF THE DRAWING

These and other objects and advantages of the invention will be apparent upon reading the following description in conjunction with the drawing, the single figure of which is a block diagram of an A/D converter system constructed in accordance with the invention.

DESCRIPTION OF THE PREFERRED EMBODIMENT

Referring to the drawing, a video source 10 of signal input is coupled to a sync tip clamp circuit 12 which, in turn, is coupled to one input of an adder circuit 14. As is well known, a conventional NTSC type video signal includes a synchronizing signal or pulse and has a magnitude that encompasses a sync tip of one polarity and variable video information of the opposite polarity. The video signal covers a total range of 140 IRE units, with 40 IRE units comprising the magnitude from the synchronizing signal back porch to the sync tip and the variable video information embracing the remaining 100 IRE units. Thus, in an ideal NTSC signal, the synchronizing signal magnitude is 40/140 of the video signal magnitude.

The output of adder 14 is supplied to the input of a gain controlled amplifier 16, the output of which is supplied to an input of an A/D converter 18. A/D converter 18, in turn, supplies a sync processing circuit 20 where the synchronizing signal information of the video signal is used to develop horizontal and vertical timing signals that are applied to a timing generator 22. The timing generator 22 is controlled by a microprocessor 24. The output of A/D converter 18 is also applied to an adder circuit 26 and to an adder circuit 46 and also delivers a quantized video output signal. As will be seen, adder 26 is in a fixed or DC information feedback loop of the video signal and adder 46 is in an AC or variable information feedback loop of the video signal.

A clamp reference source 34 is coupled for subtracting a clamp reference from the output of A/D converter 18 in adder 26. The clamp reference is a digital number that is related to the ratio of the synchronizing signal magnitude to the entire video signal. For an NTSC video signal, the clamp reference is 40/140×the video signal magnitude. Obviously, for different type signals, the clamp reference will be different. The output of adder 26 is therefore the difference between the output of A/D converter 18 and clamp reference 34. The output of adder 26 is coupled to a latch 28. Latch 28 is operated by a DC correction gate 36 that is controlled by a signal from timing generator 22. The signal from the timing generator 22 enables the latch during occurrence of the back porch of the synchronizing signal. Consequently the output of adder 26 is the difference between the sync tip level and the clamp reference and represents the amount that the sync tip must be offset to translate the video signal from the sync tip level to the back porch level. This value in the latch 28 is applied through a low pass filter 30 to a D/A converter 32. The output of D/A converter 32 consists of a first correction signal that is applied to a second input of adder 14 where the clamped video signal is offset such that the video signal input to variable gain amplifier 16 is clamped at the back porch level. As those skilled in the art will readily perceive, clamping the video signal at the back porch level is necessary to prevent changes in video signal amplitude from causing movement of the DC or black level. Thus the input of gain controlled amplifier 16 is fixed at the back porch level of the synchronizing signal.

A peak reference source 54 supplies a digital number (signal) that is subtracted from the output of A/D converter 18 in adder 46. This peak reference represents the maximum video signal level that is encountered. The output of adder 46 is coupled to another latch 48 that is operated by an AC correction gate 56. The AC correction gate 56 is also under control of timing generator 22 and, depending upon the nature of the signal being received as will be explained, operates latch 48 so that the peak output of the A/D converter is subtracted from the peak reference with the difference being stored in latch 48. The output of latch 48 is coupled to another low pass filter 50 which in turn supplies a D/A converter 52 that develops a second correction signal that is used to control the gain of gain controlled amplifier 16 (also sometimes referred to herein as variable gain amplifier 16). Thus the amplification of the video signal is adjusted as a function of the difference between the peak level of the video signal in the output of the A/D converter 18 and the peak reference from source 54. Therefore the analog video signal applied to the input of A/D converter 18 is clamped at the back porch level of the synchronizing signal and amplified to substantially fully utilize the total (dynamic) range of the A/D converter.

Microprocessor 24 is shown coupled to clamp reference circuit 34, to peak reference circuit 54 and to the low pass filters 30 and 50, respectively. Should the incoming video signal include a GCR (ghost cancellation reference) signal that would indicate the peak amplitude of the video signal and would provide an ideal peak reference 54. Since the GCR signal is sent with each line of video, the characteristics of low pass filter 50 would be adjusted (by microprocessor 24) to match the frequency of occurrence of the peak reference. Similarly, the timing generator 22 would send a signal for controlling the AC correction gate 56 to activate latch 48 when the GCR signal is present. Therefore the subtraction of the output of the A/D converter from the signal magnitude represented by the GCR signal occurs at the proper moment and is latched in latch 48. As discussed, for a conventional NTSC type signal, the clamp reference 34 may produce a digital output that is equal to 40/140 of the A/D dynamic range. This will assure that the clamped video signal is adjusted or offset by an appropriate amount to bring the back porch level to one limit of the A/D converter input. Again microprocessor 24 is used to control the characteristics of the low pass filter 30 to assure that the output of latch 28 is appropriately supplied to A/D converter 32 to provide the correct input to adder 14. Since both of the correction signals are in negative feedback loops of the output video signal, the balancing of the A/D converter system is self-correcting.

In the absence of a reference, such as a GCR signal, the video signal (over a relatively long time period) is used to develop the peak reference. The relatively long time period, preferably covering a multiple number of video fields would determine the peak video signal in the sampled period and the peak reference developed therefrom. Since the system involves negative fedback, it is, as mentioned, self-correcting to control the gain of variable gain amplifier 16 to assure optimum utilization of the dynamic range of A/D converter 18. It will be appreciated that the bandpass characteristics of low pass filter 50 would be adjusted by microprocessor 24 to match the sampling duration that is being used in the system. It should also be understood by those skilled in the art that all of the digital blocks are controlled by suitable clock signals from the timing generator, such clock inputs being omitted for clarity.

What is claimed is:

1. A balanced A/D converter system for a signal including fixed information and variable information comprising:
   an A/D converter;
   means establishing a digital clamp reference representative of the level of fixed information in said signal;
   means establishing a digital peak reference representative of the maximum level of variable information in said signal;
   means for generating first and second correction signals representing the differences between said clamp and said peak references and said level of said fixed information and said maximum level of said variable information, respectively;
   means for clamping said signal;
   means for processing said signal with said first and said second correction signals to adjust the clamping level and maximum amplitude of said signal; and
   means for applying said processed signal to said A/D converter.

2. The converter of claim 1 wherein said signal is a video signal, said fixed information comprises a synchronizing signal having a sync tip and a back porch and said variable information comprises video information.

3. The converter of claim 2 further including synchronizing signal processing means coupled to the output of said A/D converter;
   timing means coupled to said synchronizing signal processing means; and
   said timing means controlling said generating means for developing said first and second correction signals.

4. The converter of claim 3 wherein said clamping means clamps said sync tip, and further including:
   a variable gain amplifier coupled to the input of said A/D converter;
   DC offset means coupled to said clamping means for clamping said back porch at the input of said variable gain amplifier, responsive to said first correction signal; and means for controlling the gain of said variable gain amplifier as a function of said second correction signal.

5. A balanced A/D converter system for a video signal, including a synchronizing signal having a sync tip and a back porch and video information, comprising:
   an A/D converter;
   means establishing digital clamp reference representative of the amplitude of said synchronizing signal;
   means establishing a digital peak reference representative of the peak amplitude of said video information;
   means for generating first and second correction signals representing differences between said clamp and said peak references and said synchronizing signal amplitude and said video information amplitude in the output of said A/D converter, respectively;
   synchronizing signal processing means coupled to said output of said A/D converter;
   timing means coupled to said synchronizing signal processing means and controlling said generating means for developing said first and second correction signals;
   a variable gain amplifier coupled to the input of said A/D converter;
   sync tip clamp means receiving said video signal;
   DC offset means coupled to said sync tip clamp means for clamping said back porch at the input of said variable gain amplifier responsive to said first correction signal; and
   means responsive to said second correction signal for controlling the gain of said variable gain amplifier.

6. In combination:
   an A/D converter having a dynamic range;
   a video signal including a synchronizing pulse, having a magnitude determined by a sync tip and a back porch, and video information;
   means establishing a digital clamp reference representative of said magnitude of said synchronizing pulse;
   means establishing a digital peak reference representative of the maximum amplitude of said video information;
   means for developing first and second correction signals representing the differences between the output of said A/D converter and said clamp and peak references, respectively; and
   means, including clamping means, for processing said video signal at the input of said A/D converter with said correction signals for substantially fully using said dynamic range of said A/D converter.

7. The combination of claim 6 further including timing means for generating timing signals for controlling the development of said correction signals.

8. The combination of claim 7 wherein said clamping means clamp said sync tip of said video signal;

a variable gain amplifier coupled to the input of said A/D converter;

means for using said first correction signal for offsetting the video signal applied to the input of said variable gain amplifier from the level of said sync tip to the level of said back porch; and means for controlling the gain of said variable gain amplifier as a function of said second correction signal.

* * * * *